(12) United States Patent
Nicollini et al.

(10) Patent No.: US 9,292,029 B2
(45) Date of Patent: Mar. 22, 2016

(54) LOW-NOISE REFERENCE VOLTAGES DISTRIBUTION CIRCUIT

(71) Applicant: ST-Ericsson SA, Plan-les-Ouates (CH)

(72) Inventors: Germano Nicollini, Piacenza (IT); Andrea Barbieri, Casalpusterlengo (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 31 days.

(21) Appl. No.: 14/379,399

(22) PCT Filed: Feb. 26, 2013

(86) PCT No.: PCT/EP2013/053782
§ 371 (c)(1),
(2) Date: Aug. 18, 2014

(87) PCT Pub. No.: WO2013/135480
PCT Pub. Date: Sep. 19, 2013

(65) Prior Publication Data
US 2015/0035591 A1 Feb. 5, 2015

Related U.S. Application Data

(60) Provisional application No. 61/612,796, filed on Mar. 19, 2012.

(30) Foreign Application Priority Data

Mar. 16, 2012 (EP) .................................... 12159979

(51) Int. Cl.
*G05F 1/10* (2006.01)
*G05F 3/26* (2006.01)
(Continued)

(52) U.S. Cl.
CPC ........ *G05F 3/262* (2013.01); *G05F 1/56* (2013.01); *G05F 1/561* (2013.01); *G05F 3/26* (2013.01); *H03H 7/0161* (2013.01)

(58) Field of Classification Search
CPC ............... C12Q 1/6874; C12Q 1/6869; C12Q 2565/607; C12Q 2565/301; C12Q 2533/101
See application file for complete search history.

(56) References Cited

U.S. PATENT DOCUMENTS 7,218,170 B1 5/2007 Carter et al.
7,482,798 B2 * 1/2009 Han .................... H02M 1/4225
                                                          323/316
2009/0051416 A1 2/2009 Ibuka

OTHER PUBLICATIONS

International Search Report issued in corresponding International application No. PCT/EP2013/053782, date of mailing Jul. 3, 2013.
(Continued)

*Primary Examiner* — Sibin Chen
(74) *Attorney, Agent, or Firm* — Patent Portfolio Builders PLLC

(57) ABSTRACT

A low-noise reference voltages distribution circuit has a multi-output voltage-to-current converter configured to receive an input reference voltage and to provide a plurality of output reference currents to be converted into a plurality of local reference voltages by corresponding receiving circuits. The converter includes an input section, an output section and a low-pass filter. The input section generates a reference current based on the input reference voltage, and has a current mirror input transistor having a voltage controlled input terminal. The output section includes a plurality of current mirror output transistors outputting reference currents to the plurality of reference currents, respectively, and having a voltage controlled input terminal connected to a common input node. The low-pass filter has an input node connected to the voltage controlled input terminal of the current mirror input transistor and an output node connected to the common input node.

14 Claims, 4 Drawing Sheets

(51) Int. Cl.
*G05F 1/56* (2006.01)
*H03H 7/01* (2006.01)

(56) References Cited

OTHER PUBLICATIONS

Written Opinion of the International Searching Authority issued in corresponding International application No. PCT/ EP2013/053782, date of mailing Jul. 3, 2013.
European Search Report issued in corresponding European application No. EP 12 15 9979, date of completion Jul. 31, 2012.
Qian, Xinbo et al., "A CMOS Continuous-Time Low-Pass Notch Filter for EEG Systems," Analog Integrated Circuits and Signal Processing, Kluwer Academic Publishers, vol. 44, No. 3, Sep. 1, 2005, pp. 231-238, XP019204047; ISSN: 1573-1979, DOI: 10.1007/S10470-005-3007-X.
Leblebici, Y. et al., "Implementing ultra-high-value floating tunable CMOS resistors," Electronic Letters, IEE Stevenage, vol. 44, No. 5, Feb. 28, 2008, pp. 349-351, XP006030646, ISSN: 0013-5194, DOI: 10.1049/EL: 20082538.

* cited by examiner

LOW-NOISE REFERENCE VOLTAGES DISTRIBUTION CIRCUIT

TECHNICAL FIELD

The present disclosure relates to a low-noise reference voltages distribution circuit.

BACKGROUND ART

FIG. 1 schematically shows an integrated circuit comprising a prior art circuit 1 for distributing a reference voltage. In integrated circuits, for example in mixed-signal ICs, it is often felt the need of generating a precise and clean reference voltage $V_R$, normally of the bandgap type, and then buffer and distribute it with different amplification factors $1+R_1/R_0, \ldots, 1+R_N/R_0$, thus obtaining a plurality of buffered and amplified reference voltages $V_{R1}, \ldots, V_{RN}$, fed to a number of independent receiving circuits $CIR_1, \ldots, CIR_N$ belonging to the integrated circuit. Buffering is generally required in order to avoid that the load perturbs the circuit BGV_G adapted to provide the bandgap reference voltage $V_R$.

The bandgap reference voltage $V_R$ has generally very low noise and is referred to a clean ground. In order to have minimum noise injection and/or best power supply rejection it is desired that also the buffered/amplified reference voltages $V_{R1}, \ldots, V_{RN}$ have low noise and are referred to their local and noisy grounds $GND_1, \ldots, GND_N$. For example, let's assume that one of the buffered/amplified reference voltages for $V_{R1}, \ldots, V_{RN}$, for example $V_{R1}$, is used as reference voltage for a receiving circuit in the form of an analog-to-digital converter $CIR_1$ built on its proper local ground $GND_1$. By definition, an analog-to-digital converter compares the input signal to be converted with the difference between its reference voltage $V_{R1}$ and its local ground $GND_1$. A man skilled in the field knows that the buffered/amplified reference voltage $V_{R1}$ shall be noise free, otherwise the A/D conversion provided by $CIR_1$ would be affected by its noise, and for the same reason the reference voltage $V_{R1}$ shall also to be referred to its local ground $GND_1$.

The prior art solution shown in FIG. 1 is affected by two main drawbacks. The first drawback is due to the fact that a relatively long path L, which usually does not have very low output impedance, can collect noise or disturbances which result into crosstalk or pollution among the different circuits $CIR_1, \ldots, CIR_N$ of the chip. The second more important drawback is due to the fact that the noise $Vn_{GNDi}$ of each local ground $i=1, \ldots, N$ is amplified by a factor $-R_i/R_0$ at the amplifier $OA_i$ output, as know by an expert of the field, thus the buffered and amplified reference voltage $VR_i$ is not properly referred to its local ground because of a $(-R_i/R_0-1) Vn_{GNDi}$ noise term which impacts the difference $VR_i-GND_i$. This is therefore the ultimate limitation of the above described solution even if ideal and noise free amplifier and resistors are assumed.

According to the prior art, the first of the above indicated drawbacks can be solved or limited by building buffering and amplification circuits close to the bandgap voltage generation block BGV_G. However, this expedient does not help to solve the second of the above mentioned drawbacks.

SUMMARY OF THE INVENTION

In view of the above described drawbacks, it is an object of the present invention to provide a reference voltages distribution circuit which is adapted to overcome at least the afore mentioned second drawback described above with reference to the prior art reference voltages distribution circuits.

The above object is reached by a reference voltages distribution circuit comprising a voltage to current converter adapted to receive an input reference voltage for providing a plurality of output reference currents to be converted into a plurality of local reference voltages at corresponding receiving circuits adapted to be connected to the reference voltages distribution circuit. The voltage to current converter comprises an input section adapted to generate on the basis of said input reference voltage a reference current. The input section comprises a current mirror input transistor having a voltage controlled input terminal. The voltage to current converter comprises an output section comprising a plurality of current mirror output transistors each adapted to provide a corresponding output reference current of said plurality of reference currents. Each of said current mirror output transistors comprises a voltage controlled input terminal. The output section comprises a common input node to which voltage controlled input terminals of said current mirror output transistors are connected. The voltage to current converter comprises a low-pass filter having an input node connected to said voltage controlled input terminal of the current mirror input transistor and an output node connected to said common input node. Thanks to the provision of the low-pass filter the above described circuit allows to advantageously implement accurate (precise and low noise) local reference voltages, which are referred to their local noisy grounds, starting from a common noise-free reference voltage, preferably of the bandgap type, without significant increase of area and consumption at system level.

The low-pass filter comprises a first MOS transistor having a first terminal connected to the input node of the low-pass-filter, a second terminal connected to the output node of the low-pass filter and a gate terminal. The low-pass filter further comprises a biasing circuit of the first MOS transistor adapted to apply to its gate terminal a DC control voltage such that the first MOS transistor operates in a weak inversion or sub-threshold region, wherein said control voltage is such to determine a desired resistance value R between said first terminal and said second terminal of the first MOS transistor.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures identical or similar elements will be indicated with the same reference numbers/symbols.

Figure 1:
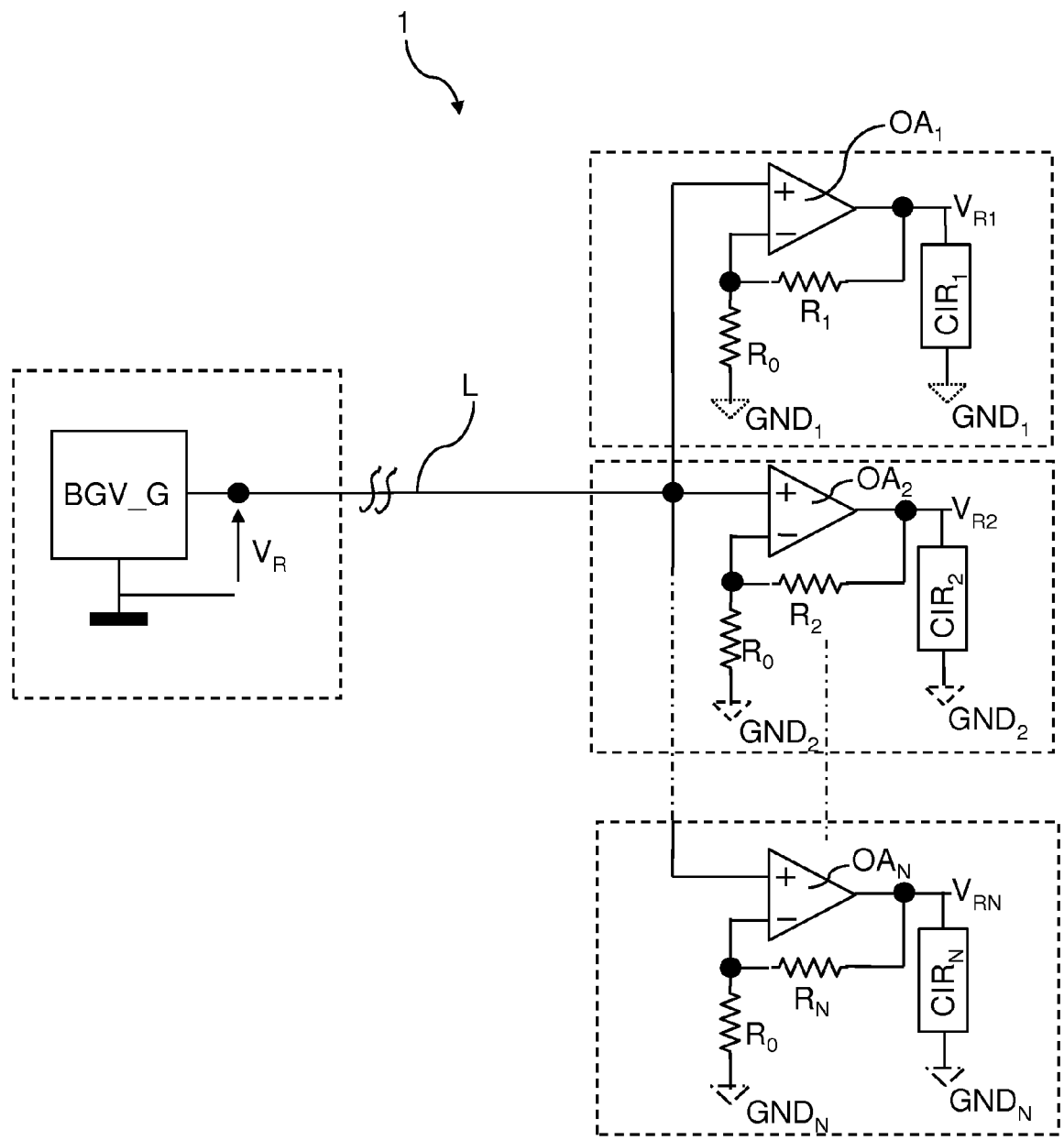
FIG. 1 shows a schematic view of a prior art integrated circuit comprising a reference voltages distribution circuit connected to a plurality of receiving circuits.
Figure 2:
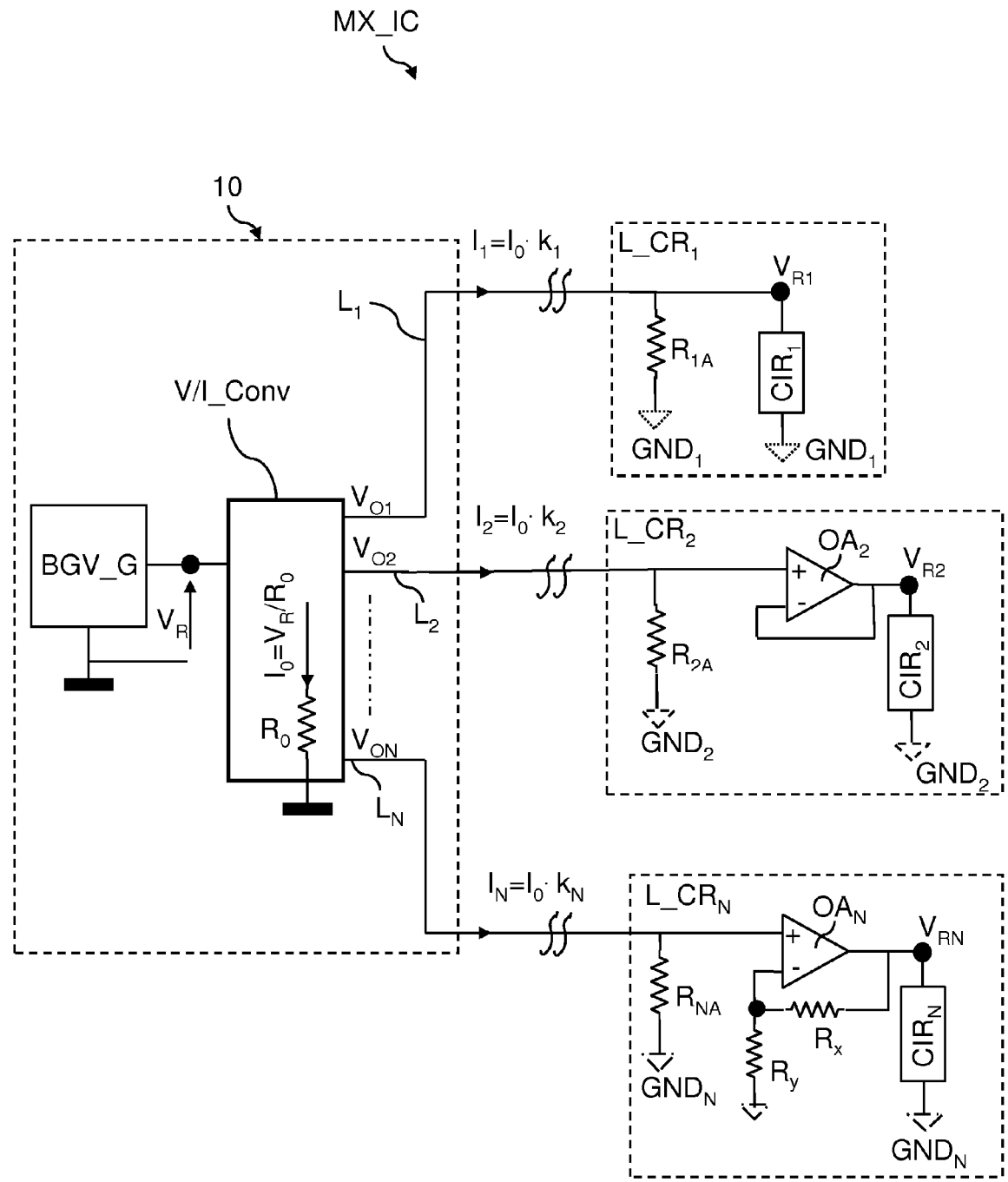
FIG. 2 shows a schematic block diagram of a first embodiment of an integrated circuit comprising a reference voltages distribution circuit, comprising a multi-output voltage to current converter, connected to a plurality of receiving circuits of the integrated circuit.

FIG. 2 shows a very schematic view of an embodiment of an integrated circuit MX_IC, for example a mixed signal integrated circuit, comprising a reference voltages distribution circuit 10 and a plurality of receiving circuits L_$CR_1, \ldots, L\_CR_N$ connected to the reference voltages distribution circuit 10 through lines $L_1, \ldots, L_N$. Each receiving circuit L_$CR_1, \ldots,$ L_$CR_N$ has a respective local ground $GND_1, \ldots, GND_N$.

The reference voltages distribution circuit 10 comprises a reference voltage generation block BGV_G adapted to output a reference voltage $V_R$, for example a bandgap reference voltage $V_R$.

The reference voltages distribution circuit 10 comprises a multi-output voltage to current converter V/I_Conv adapted to receive at input the reference voltage $V_R$ for providing a plurality of N output reference currents $I_1, \ldots, I_N$ to be converted into a plurality of N local reference voltages $V_{O1}, \ldots, V_{ON}$ at corresponding receiving circuits $LCR_1, \ldots, LCR_N$ connected to, or adapted to be connected to, the reference voltages distribution circuit 10. The receiving circuits L_$CR_1, \ldots,$ L_$CR_N$ have local resistors $R_{1A}, \ldots, R_{NA}$ and the local reference voltages $V_{O1}, \ldots, V_{ON}$ are obtained as voltage drops deriving from the flow of the output reference currents $I_1, \ldots, I_N$ through said local resistors $R_{1A}, \ldots, R_{NA}$. In other words $V_{O1}=I_1*R_{1A}, \ldots, V_{ON}=I_N*R_{NA}$.

Different examples of possible receiving circuits L_$CR_1, \ldots,$ L_$CR_N$ are shown in FIG. 2. For example in receiving circuit L_$CR_1$ the local reference voltage $V_{O1}$ is used as it is as a reference voltage $V_{R1}$ fed directly to a local sub-circuit $CIR_1$. In receiving circuit L_$CR_2$ the local reference voltage $V_{O2}$ is buffered by means of a buffer amplifier $OA_2$ in order to obtain a reference voltage $V_{R2}$ used to feed after buffering a local sub-circuit $CIR_2$. In receiving circuit L_$CR_N$ the local reference voltage $V_{ON}$ is amplified of a factor $1+R_x/R_y$ by means of an amplifier $OA_N$ having feedback resistors $R_x$ and $R_y$ in order to obtain a reference voltage $V_{RN}$ used to feed after amplification a local sub-circuit $CIR_N$.

The multi-output voltage to current converter V/I_Conv has a converting resistor $R_0$ and is adapted to convert the input reference voltage $V_R$ into a reference current $I_0=V_R/R_0$ and output the N reference currents $I_1=k_1*I_0, \ldots, I_N=K_N*I_0$ in which $k_1, \ldots, k_N$ are current amplification factors. Since $V_{O1}=V_R*K_1*R_{1A}/R_0+GND_1, \ldots, V_{ON}=V_R*K_N*R_{1N}/R_0+GND_N$ it is clear that the local reference voltages $V_{O1}, \ldots, V_{ON}$ are ideally referred to the local noisy grounds $GND_1, \ldots, GND_N$ of the respective receiving circuits L_$CR_1, \ldots,$ L_$CR_N$.

Figure 3:
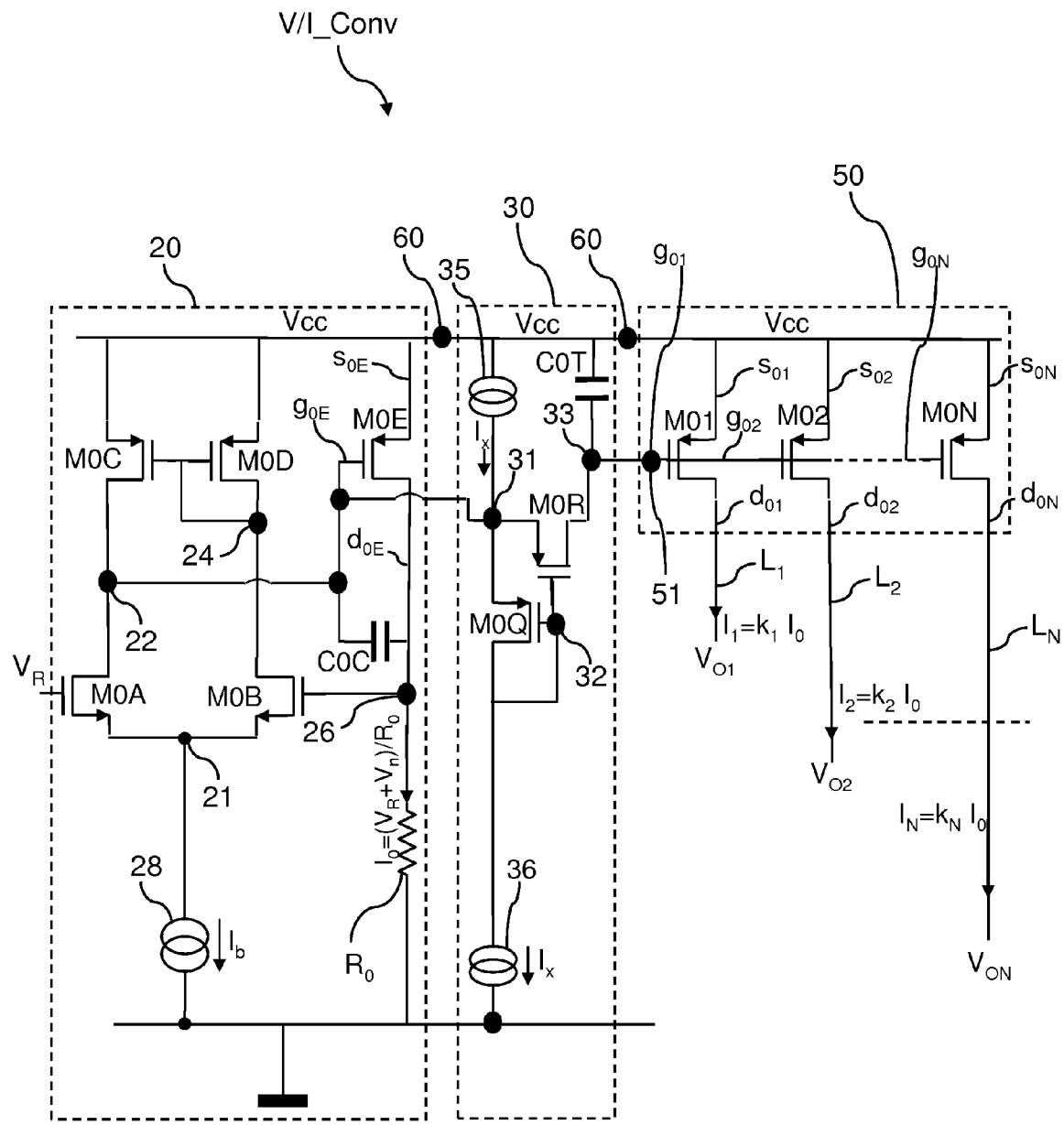
FIG. 3 shows a schematic circuit layout of an embodiment of the multi-output voltage to current converter of FIG. 2, said voltage to current converter comprising a low-pass filter.

FIG. 3 schematically shows an embodiment of the multi-output voltage to current converter V/I_Conv of FIG. 2 which is adapted to provide low noise output reference currents $I_1, \ldots, I_N$.

The multi-output voltage to current converter V/I_Conv comprises an input section 20 adapted to generate on the basis of the input reference voltage $V_R$ the reference current $I_0$ as a current flowing in the converting resistor $R_0$ due to the drop of the reference voltage $V_R$ across the converting resistor $R_0$. In the particular example shown in FIG. 3, the input section 20 comprises a multistage CMOS amplifier M0A, M0B, M0C, M0D, M0E and more in detail a preferred and non-limiting embodiment in which the multistage CMOS amplifier is a two-stage CMOS amplifier.

In the particular example shown in FIG. 2 transistors M0A, M0B, M0C, M0D form the input stage of the multistage CMOS amplifier M0A, M0B, M0C, M0D, M0E. In the particular example shown, without for this reason introducing any limitation, the source terminals of NMOS transistors M0A, M0B are connected together at common node 21. A current generator of a current $I_B$ is adapted to bias transistors M0A and M0B and is connected between the common node 21 and ground GND. The drain terminals of transistors M0A and M0B are connected to the drain terminals of PMOS transistors M0C and M0D respectively, at common nodes 22 and 24 respectively. The source terminals of PMOS transistors M0C and M0D are connected to Vcc at common node 60, while the gate terminals of said transistors are both connected to common node 24. The gate terminal of transistor M0A is adapted to receive the input reference voltage $V_R$ while the gate terminal of M0B is connected at common node 26 to one end of the conversion resistor $R_0$. The opposite end of the conversion resistor $R_0$ is connected to ground GND.

The input section 20 comprises a current mirror input transistor M0E having a voltage controlled input terminal $g_{0E}$. In the particular example shown in FIG. 3, the voltage controlled input terminal $g_{0E}$ is connected to common node 22. Moreover, in said example the current mirror input transistor M0E is a MOS transistor and includes a source terminal $S_{0E}$ connected to Vcc at common node 60 and a drain terminal $D_{0E}$ connected to the common node 26. A capacitor C0C may be provided between the common nodes 22 and 26, if the frequency compensation of the input section 20 so requires.

It should be observed that in the particular example shown in FIG. 3 the current mirror input transistor M0E represents the output stage of the multistage amplifier M0A, M0B, M0C, M0D, M0E of the input section 20.

The multi-output voltage to current converter V/I_Conv comprises an output section 50 comprising a plurality of current mirror output transistors M01, . . . , M0N each adapted to operate with the current mirror input transistor M0E in order to provide a corresponding output reference current of the plurality of output reference currents $I_1, \ldots, I_N$. Each of the current mirror output transistors M01, . . . , M0N comprises a voltage controlled input terminal $g_{01}, \ldots, g_{0N}$. The output section 50 comprises a common input node 51 to which voltage controlled input terminals $g_{01}, \ldots, g_{0N}$, namely the gate terminals $g_{01}, \ldots, g_{0N}$, of the current mirror output transistors M01, . . . , M0N are connected. It is clear from the above description that the output reference currents $I_1, \ldots, I_N$ are obtained by mirroring the reference current $I_0$. It is also clear that by appropriately dimensioning the current mirror output transistors M01, . . . , M0N with respect to the current mirror input transistor M0E it is possible to obtain desired current amplification factors $k_1, \ldots, k_N$ for the output reference currents $I_1, \ldots, I_N$. In other words, if M01=$k_1$ M0E, . . . , M0N=$k_N$M0E then $I_1=k_1I_0, \ldots, I_N=k_NI_0$.

According to an embodiment, the drains of the current mirror input transistor M0E and the plurality of current mirror output transistors M01, . . . , M0N are connected with the sources of respective additional transistors (not shown) in a cascode configuration. Preferably the drains of transistors M0C and M0D of the input section 20 are also connected to the sources of respective additional transistors (not shown) in a cascode configuration. The above expedient increases the gain of the multistage amplifier and improves the accuracy of the voltage to current conversion.

In the particular and non-limiting example shown in FIG. 3, the current mirror output transistors M01, . . . , M0N are PMOS transistors having source terminals $s_{01}, \ldots, s_{0N}$ connected to Vcc at common node 60 and having drain terminals $d_{01}, \ldots, d_{0N}$ connected to the output lines $L_1, \ldots, L_N$ respectively.

With reference to FIG. 3, it is clear that the multistage amplifier M0A, M0B, M0C, M0D, M0E has a voltage drop $V_R+V_n$ across converting resistor $R_0$ in which $V_R$ is the reference voltage inputted at the transistor M0A and $V_n$ is the equivalent input noise voltage of the multistage amplifier M0A, M0B, M0C, M0D, M0E. Such equivalent input noise voltage substantially depends on the dimensions and currents of the transistors of the multistage amplifier M0A, M0B, M0C, M0D, M0E. In particular larger dimensions and greater currents determine a lower equivalent input noise voltage. It is clear that also the converting resistor $R_0$ can represent a noise source but the contribution of $R_0$ is negligible with respect to the value of the equivalent input noise voltage $V_n$.

In view of the above, it is important to observe that the current $I_0$ trough $R_0$ is $I_0=(V_R+V_n)/R_0$ and it is not noise free due to the contribution of $V_n$. However, in order to provide low noise output reference currents $I_1, \ldots, I_N$ the voltage to current converter V/I_Conv comprises a low-pass filter 30 having an input node 31 connected to the voltage controlled input terminal $g_{0E}$ of the current mirror input transistor M0E and an output node 33 connected to the common input node 51 of the output section 50. The low-pass filter 30 can be defined as a common low-pass filter since it is a single filter shared among the plurality of current mirror output transistors M01, . . . , M0N and interposed between the current mirror input transistor M0E and each current mirror output transistor of the plurality of current mirror output transistors M01, . . . , M0N.

According to an embodiment the low-pass filter 30 comprises at least a first MOS transistor M0R having a first terminal connected to the input node 31 of the low-pass filter 30, a second terminal connected to the output node 33 of the low-pass filter 30 and a gate terminal. In the particular example shown in FIG. 3, the MOS transistor M0R is a PMOS transistor having a source terminal connected to the input node 31 and a drain terminal connected to the output node 33. The low-pass filter 30 comprises a biasing circuit 35, 36, M0Q of the first MOS transistor M0R adapted to apply to the gate terminal a DC control voltage such that the first MOS transistor M0R operates in a weak inversion or sub-threshold region, wherein said control voltage is such to determine a desired resistance value R between said first terminal and said second terminal of the first MOS transistor M0R. According to an embodiment, the above indicated resistance value R is in the Giga-ohm range and is for example comprised in the range 0.5 GΩ-5 GΩ and for example equal to about 1 GΩ.

According to an embodiment the low-pass filter 30 is an RC filter with a time constant having value R*C wherein:
R the resistance value between said first terminal and said second terminal of the first MOS transistor M0R;
C is a capacitance value greater or equal to the equivalent input capacitance of the output section 50.
the values of R and C of the time constant value R*C are selected in order to obtain a desired value for the cutoff frequency of the low-pass filter 30.

For example, according to an embodiment the low-pass filter 30 has a cutoff frequency not greater than 10 Hz. In a particular and non-limiting embodiment said cutoff frequency is in the few Hertz order, for example of about 1 Hz.

According to an embodiment each of the current mirror output transistors M01, . . . , M0N is a MOS transistor having a gate terminal $g0_1, \ldots, g0_N$ connected to the common input node 51 of said the output section 50, and the equivalent input capacitance of the output section 50 is equal to the sum of the gate capacitances of the current mirror output transistors M01, . . . , M0N. If said equivalent input capacitance is not large enough in order to obtain a desired value for the R*C time constant of the low-pass filter 30, it is possible to advantageously provide in the low-pass filter 30 a capacitor COT having a first end connected to the output node 33 of the low-pass filter 30 and a second end connected to common node 60, which in the example represented in FIG. 3 is fed with Vcc.

According to an embodiment, the biasing circuit 35, 36, M0Q comprises:
a first current generator 35;
a second current generator 36;
at least a second MOS transistor M0Q having a diode configuration and being placed between the first 35 and the second 36 current generator and having a gate terminal connected at node 32 to the gate terminal of the first MOS transistor M0R and a source terminal connected to the input node 31 of the low-pass-filter 30.

According to a more detailed embodiment the first and second current generators 35, 36 are adapted to generate currents $I_x$ having a same current value, said current value being in the few microamperes range, for example equal to about 1 μA. According to an embodiment said current value is for example comprised in the range 0.1-1 μA.

Figure 4:
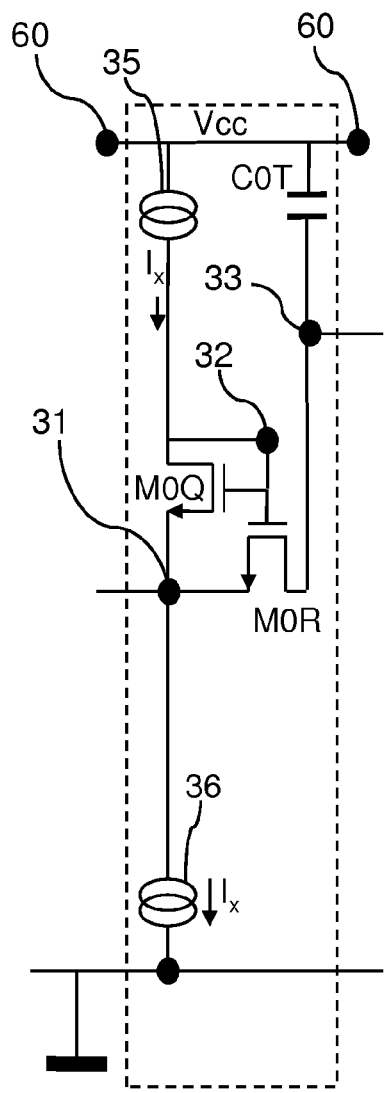
FIG. 4 shows a schematic circuit layout of a first variant embodiment of the low-pass filter of FIG. 3.

In FIG. 4 a first variant embodiment of the low-pass filter 30 of FIG. 3 is shown in which transistors M0Q and M0R are NMOS transistors instead of being PMOS transistors.

Figure 5:
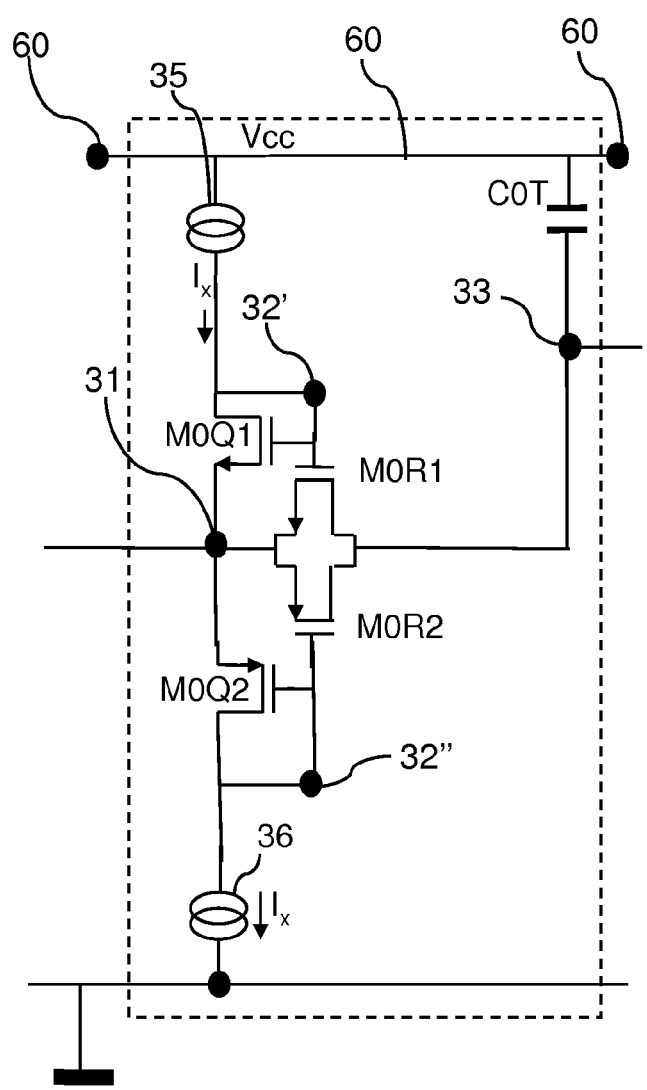
FIG. 5 shows a schematic circuit layout of a second variant embodiment of the low-pass filter of FIG. 3.

In FIG. 5 a second variant embodiment of the low-pass filter 30 of FIG. 3 is shown in which PMOS transistors M0Q and M0R of FIG. 3 have been replaced by CMOS transistors M0Q1, M0Q2, M0R1, M0R2 and in which node 32 of FIG. 3 has been split into two nodes 32', 32" respectively for connecting together:
the gate and the drain terminals of transistor M0Q1 with the gate terminal of transistor M0R1;
the gate and the drain terminals of transistor M0Q2 with the gate of transistor M0R2.

On the basis of the above disclosure, it can be seen how the objects of the present invention are fully reached. In particular, in the above described reference voltages distribution circuit the low-pass filter 30 is able to filter all the noise present on the current $I_0$ before current mirroring/amplification is performed. In this way, reference currents $I_1, \ldots, I_N$ and, in turn, $V_{O1}, \ldots, V_{ON}$ are ideally noise free. In reality they are affected by the noise of the transistors M01, . . . , M0N and local resistors $R_{1A}, \ldots, R_{NA}$, which however can easily be made very low by properly sizing M01, . . . , M0N dimensions and currents and the resistance values of resistors $R_{1A}, \ldots, R_{NA}$, as known to a man skilled in the field.

The above described circuit allows to advantageously implement accurate, i.e. precise and low noise, local reference voltages, which are referred to their local noisy grounds, starting from a common noise-free reference voltage, preferably of the bandgap type, without significant increase of area and consumption at system level. It is important to observe that, thanks to the provision of the above disclosed low-pass filter 30, since it is not important to convert the reference voltage $V_R$ into a noise free reference current $I_0$, it is possible keep reduced the dimensions of the transistors and the power consumption of the input section 20.

According to an embodiment it is also possible to integrate on the chip, the input section 20, the low-pass filter 30, the output section 50 at relatively short distances among them. Said distances are for example relatively short with respect to relatively long distances, along lines L1, . . . , LN, between the voltage to current converter V/I_Conv and each of the receiving circuits $LCR_1, \ldots, LCR_N$. This expedient allows overcoming also the first drawback above explained in the background art with reference to the known voltage distribution circuits.

Naturally, in order to satisfy contingent and specific requirements, a person skilled in the art may apply to the above-described reference voltages distribution circuit many modifications and variations, all of which, however, are included within the scope of protection of the invention as defined by the following claims.

The invention claimed is:

1. A reference voltages distribution circuit comprising:
a multi-output voltage to current converter configured to receive an input reference voltage and to provide a plurality of output reference currents to be converted into a plurality of local reference voltages at corresponding receiving circuits connected to said reference voltages distribution circuit, the multi-output voltage to current converter including:
an input section configured to generate a reference current based on the input reference voltage, the input section comprising a current mirror input transistor having a voltage controlled input terminal;
an output section having
a plurality of current mirror output transistors each configured to provide a corresponding output reference current of the plurality of output reference currents, and
a common input node to which voltage controlled input terminals of the current mirror output transistors are respectively connected; and
a low-pass filter having an input node connected to the voltage controlled input terminal of the current mirror input transistor, and an output node connected to the common input node of the output section, said low pass filter including:
a first MOS transistor having a first terminal connected to the input node of the low-pass-filter, a second terminal connected to the output node of the low-pass filter, and a gate terminal; and
a biasing circuit of said first MOS transistor configured to apply a DC control voltage to said gate terminal of the first MOS transistor such that the first MOS transistor operates in a weak inversion or a sub-threshold region, wherein said control voltage causes a desired resistance value R between said first terminal and said second terminal of the first MOS transistor.

2. The reference voltages distribution circuit according to claim 1, wherein said desired resistance value R is in the Giga-ohm range.

3. The reference voltages distribution circuit according to claim 1, wherein the low-pass filter is an RC filter with a time constant having value R*C, where:
R is said desired resistance value between said first terminal and said second terminal of the first MOS transistor, and
C is a capacitance value greater than or equal to an equivalent input capacitance of the output section,
said time constant value R*C being selected such that to obtain a desired value for a cutoff frequency of the low-pass filter.

4. The reference voltages distribution circuit according to claim 3, wherein each of the current mirror output transistors is a MOS transistor having a gate terminal connected to said common input node of said output section, said equivalent input capacitance of the output section being equal to a sum of gate capacitances of the current mirror output transistors.

5. The reference voltages distribution circuit according to claim 1, wherein each of said current mirror output transistors has a terminal connected to the common node, and the low-pass filter further comprises a capacitor having a first end connected to the output node of said low-pass filter and a second end connected to said common node.

6. The reference voltages distribution circuit according to claim 1, wherein the low-pass filter has a cutoff frequency not greater than 10 Hz.

7. The reference voltages distribution circuit according to claim 1, wherein said biasing circuit comprises:
a first current generator;
a second current generator;
at least a second MOS transistor having a diode configuration, being connected between the first and the second current generator, and having a gate terminal connected to said gate terminal of the first MOS transistor and a source terminal connected to the input node of the low-pass-filter.

8. The reference voltages distribution circuit according to claim 7, wherein said first and second current generators are configured to generate currents having a same current value, said current value being not greater than 1 μA.

9. The reference voltages distribution circuit according to claim 1, wherein drains of the current mirror input transistor and of each of the plurality of current mirror output transistors are connected with sources of respective additional transistors in a cascode configuration.

10. The reference voltages distribution circuit according to claim 1, wherein in said multi-output voltage to current converter, the input section, the low-pass filter and the output section are integrated on a same chip.

11. The reference voltages distribution circuit according to claim 1,
wherein the input section is a multi-stage CMOS amplifier comprising an input stage and an output stage, and
wherein said output stage comprises said current mirror input transistor.

12. The reference voltages distribution circuit according to claim 1, wherein the input section is a two-stage CMOS amplifier.

13. A mixed signal integrated circuit comprising a reference voltages distribution circuit including a multi-output voltage to current converter configured to receive an input reference voltage and to provide a plurality of output reference currents to be converted into a plurality of local reference voltages at corresponding receiving circuits connected to said reference voltages distribution circuit, the multi-output voltage to current converter including:
an input section configured to generate a reference current based on the input reference voltage, the input section comprising a current mirror input transistor having a voltage controlled input terminal;
an output section having
a plurality of current mirror output transistors each configured to provide a corresponding output reference current of the plurality of output reference currents, and
a common input node to which voltage controlled input terminals of the current mirror output transistors are respectively connected; and
a low-pass filter having an input node connected to the voltage controlled input terminal of the current mirror input transistor, and an output node connected to the common input node of the output section, said low pass filter including:
a first MOS transistor having a first terminal connected to the input node of the low-pass-filter, a second terminal connected to the output node of the low-pass filter, and a gate terminal, and a biasing circuit of said first MOS transistor configured to apply a DC control voltage to said gate terminal of the first MOS transistor such that the first MOS transistor operates in a weak inversion or a sub-threshold region, wherein said control voltage causes a desired resistance value R between said first terminal and said second terminal of the first MOS transistor.

14. A method to provide a plurality of local reference voltages to corresponding receiving circuits, the method comprising:
providing the plurality of local reference voltages to the corresponding receiving circuits using a reference voltages distribution circuit including a multi-output voltage to current converter configured to receive an input reference voltage and to provide a plurality of output reference currents to be converted into a plurality of local reference voltages at corresponding receiving circuits connected to said reference voltages distribution circuit,
wherein the multi-output voltage to current converter includes:
an input section configured to generate a reference current based on the input reference voltage, the input section comprising a current mirror input transistor having a voltage controlled input terminal;
an output section having
a plurality of current mirror output transistors each configured to provide a corresponding output reference current of the plurality of output reference currents, and
a common input node to which voltage controlled input terminals of the current mirror output transistors are respectively connected; and
a low-pass filter having an input node connected to the voltage controlled input terminal of the current mirror input transistor, and an output node connected to the common input node of the output section, said low pass filter including:
a first MOS transistor having a first terminal connected to the input node of the low-pass-filter, a second terminal connected to the output node of the low-pass filter, and a gate terminal, and
a biasing circuit of said first MOS transistor configured to apply a DC control voltage to said gate terminal of the first MOS transistor such that the first MOS transistor operates in a weak inversion or a sub-threshold region, wherein said control voltage causes a desired resistance value R between said first terminal and said second terminal of the first MOS transistor.

\* \* \* \* \*